US006930901B2

(12) United States Patent
Abbott et al.

(10) Patent No.: US 6,930,901 B2
(45) Date of Patent: Aug. 16, 2005

(54) METHOD OF SELECTIVELY FORMING LOCAL INTERCONNECTS USING DESIGN RULES

(75) Inventors: Todd Abbott, Boise, ID (US); Jigish D. Tirvedi, Boise, ID (US); Mike Violette, Boise, ID (US); Chuck Dennison, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 419 days.

(21) Appl. No.: 10/245,679

(22) Filed: Sep. 17, 2002

(65) Prior Publication Data

US 2003/0036258 A1 Feb. 20, 2003

Related U.S. Application Data

(62) Division of application No. 09/988,960, filed on Nov. 19, 2001, now Pat. No. 6,594,172, which is a division of application No. 09/652,070, filed on Aug. 31, 2000, now Pat. No. 6,535,413.

(51) Int. Cl.$^7$ ................................................. G11C 5/06
(52) U.S. Cl. ........................... 365/63; 365/63; 438/597; 438/598; 257/758
(58) Field of Search ............................ 365/63; 438/597, 438/598; 257/758

(56) References Cited

U.S. PATENT DOCUMENTS

| | | | |
|---|---|---|---|
| 4,216,489 A | | 8/1980 | Clemens et al. |
| 4,673,966 A | * | 6/1987 | Shimoyama ................. 257/211 |
| 4,873,204 A | | 10/1989 | Wong et al. |
| 5,043,778 A | * | 8/1991 | Teng et al. .................. 257/374 |
| 5,082,796 A | | 1/1992 | El-Diwany et al. |
| 5,156,994 A | * | 10/1992 | Moslehi ...................... 438/647 |
| 5,172,211 A | * | 12/1992 | Godinho et al. ............. 257/536 |
| 5,173,450 A | | 12/1992 | Wei |
| 5,227,649 A | * | 7/1993 | Chapman |
| 5,320,975 A | | 6/1994 | Cederbaum et al. |
| 5,360,757 A | | 11/1994 | Lage |
| 5,382,832 A | * | 1/1995 | Buti et al. ................... 257/773 |
| 5,543,361 A | | 8/1996 | Lee et al. |
| 5,635,426 A | | 6/1997 | Hayashi et al. |
| 5,656,861 A | | 8/1997 | Godinho et al. |
| 5,668,065 A | | 9/1997 | Lin |
| 5,702,988 A | | 12/1997 | Liang |
| 5,717,242 A | | 2/1998 | Michael et al. |
| 5,719,079 A | | 2/1998 | Yoo et al. |
| 5,759,889 A | | 6/1998 | Sakao |
| 5,831,899 A | | 11/1998 | Wang et al. |
| 5,844,836 A | | 12/1998 | Kepler et al. |
| 5,861,676 A | | 1/1999 | Yen |
| 5,866,451 A | | 2/1999 | Yoo et al. |
| 5,899,742 A | | 5/1999 | Sun |
| 5,924,008 A | | 7/1999 | Michael et al. |
| 5,943,567 A | | 8/1999 | Chang |
| 5,990,513 A | | 11/1999 | Perino et al. |
| 5,994,777 A | * | 11/1999 | Farrar ......................... 257/758 |
| 6,015,730 A | | 1/2000 | Wang et al. |
| 6,091,129 A | * | 7/2000 | Cleeves ....................... 257/510 |
| 6,146,978 A | * | 11/2000 | Michael et al. ............. 438/453 |
| 6,159,828 A | | 12/2000 | Ping et al. |
| 6,174,764 B1 | | 1/2001 | Manning |
| 6,211,050 B1 | * | 4/2001 | Wong ........................... 438/597 |

(Continued)

*Primary Examiner*—Viet Q. Nguyen
(74) *Attorney, Agent, or Firm*—Thorp Reed & Armstrong LLP (57) ABSTRACT

The invention includes a method of fabricating a circuit in a manner to place certain structures within a predefined distance of one another. Electrical connections are formed between certain structures of silicon, by annealing a conductive material to cause silicon out-diffusing to form local interconnects. The silicon out-diffusion can be facilitated without a masking step thereby simplifying as well as speeding up the fabrication process. The invention also includes a local interconnect thus formed.

5 Claims, 8 Drawing Sheets

U.S. PATENT DOCUMENTS 6,239,459 B1     5/2001  Al-Shareef et al.
6,261,964 B1 *   7/2001  Wu et al. .................. 438/705
6,287,904 B1 *   9/2001  Lee et al.
6,327,182 B1 * 12/2001  Shum et al. ........... 365/185.17
6,535,413 B1 *   3/2003  Abbott et al. ................. 365/63
6,594,172 B2 *   7/2003  Abbott et al. ................. 365/63
6,727,168 B2 *   4/2004  Abbott ...................... 438/618
2002/0187648 A1 * 12/2002  Wu et al. .................. 438/745

* cited by examiner

METHOD OF SELECTIVELY FORMING LOCAL INTERCONNECTS USING DESIGN RULES

This application is a divisional of U.S. patent application Ser. No. 09/988,960 filed 19 Nov. 2001, now U.S. Pat. No. 6,594,172 which is a divisional of U.S. patent application Ser. No. 09/652,070 filed 31 Aug. 2000 now U.S. Pat No. 6,535,413.

BACKGROUND OF THE INVENTION

1. Field of the Invention

The present invention is related to the fabrication of solid state devices and, more particularly, to the fabrication of local interconnects.

2. Description of the Background

Local interconnects are a mechanism used during the fabrication of solid state devices to make connections between structures, such as between the terminals of transistors, to thereby provide electrical interconnections between devices. "Local interconnects", as the name implies, refers to interconnects that extend between adjacent devices, or devices that are relatively close to one another, as opposed to connections extending across a circuit or chip. Connections that are approximately thirty microns or less are typically referred to as local interconnects.

Figure 9:
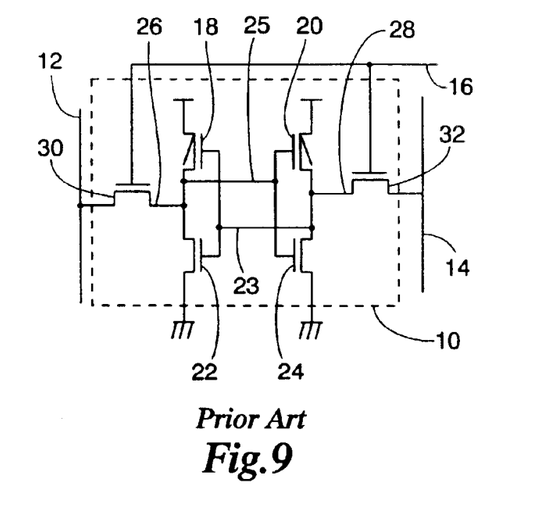
FIG. 9 is a conventional 6 transistor SRAM cell constructed according to the teachings of the prior art.

One type of circuit where local interconnects are used is a six transistor, static random access memory, or 6T SRAM. A circuit diagram of a 6T SRAM cell is illustrated in FIG. 9. In FIG. 9, a 6T SRAM cell 10 is coupled between complimentary bit lines 12 and 14 and is coupled to a word line 16. Memory cell 10 includes a load transistor 18, a load transistor 20, a drive or pull down transistor 22 and a drive or pull down transistor 24. Transistors 18, 20, 22 and 24 are coupled together to form cross-coupled inverters having a storage node 26 and a storage node 28.

Transistors 18 and 20 are preferably P-channel transistors, but may be replaced by polysilicon or other resistors, N-channel depletion mode transistors, or other electrical devices for raising the voltage at storage nodes 26 and 28 when pull down transistors 22 and 24 are turned off, respectively. Pull down transistors 22 and 24 are preferably N-channel transistors, although other types of transistors such as bipolar transistors or other devices may be utilized.

Storage node 26 is coupled to a pass gate transistor 30 which is controlled by word line 16. Storage node 28 is coupled to a pass gate transistor 32 which is also controlled by word line 16. Pass gate transistors 30 and 32 are preferably N-channel enhancement mode transistors, although other types of transistors may be utilized.

Transistors 18 and 22 form a first inverter having an input at conductive line 23, and transistors 20 and 24 form a second inverter having an input at conductive line 25. Conductive line 23 is coupled to the output of the second inverter formed by transistors 20 and 24 (i.e. storage node 28). Similarly, conductive line 25 is coupled to the output of the first inverter formed by transistors 18 and 22 (i.e. storage node 26). Thus, transistors 18, 20, 22 and 24 form cross coupled inverters having outputs at storage nodes 26 and 28.

In operation, cell 10 stores logic signals, or information such as a logic 1 (e.g., VCC) or logic 0 (e.g., ground) on nodes 26 and 28.

Figure 10:
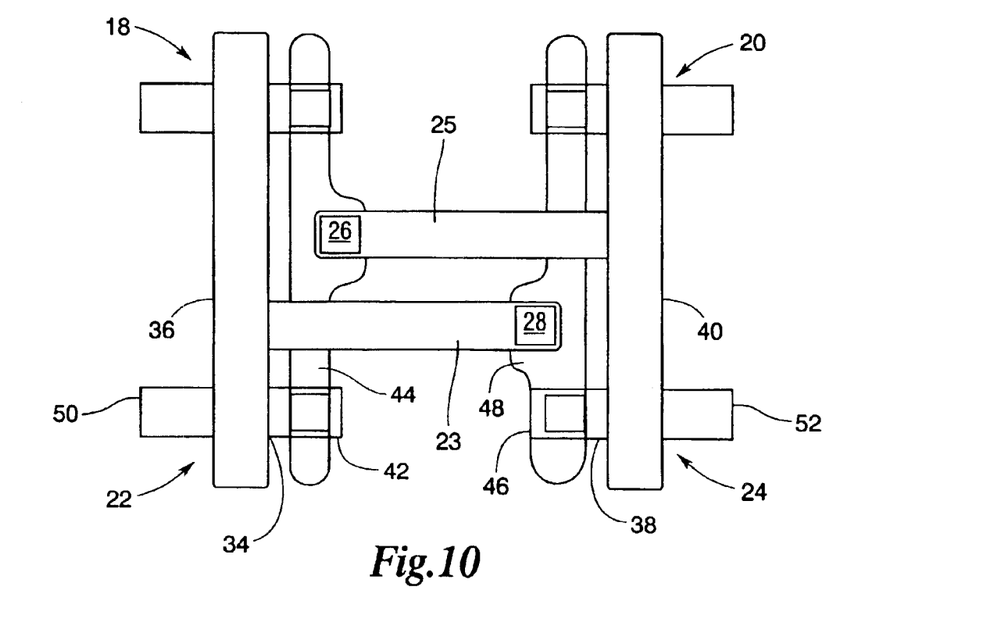
FIG. 10 is a top view looking down on a portion of the circuit shown in FIG. 9.

With reference to FIG. 10, a top view schematic layout drawing of a portion of cell 10 is shown. Transistors 18, 20, 22 and 24 are illustrated as lateral transistors. Alternatively, transistors 18, 20, 22 and 24 can be vertical transistors, or thin film transistors. A gate 34 of transistor 22 is coupled to node 28 via polysilicon conductive lines 23 and 36 and a gate 38 of transistor 24 is coupled to node 26 via polysilicon conductive lines 25 and 40. Lines 23, 36 and 25, 40 cross couple transistors 18, 20, 22 and 24.

A drain 42 of transistor 22 is coupled to node 26 via a local interconnect 44, and a drain 46 of transistor 24 is coupled to node 28 via a local interconnect 48. A source 50 of transistor 22 is coupled to ground, and a source 52 of transistor 24 is coupled to ground.

The local interconnect 44 is electrically coupled to the polysilicon conductive line 25 at node 26. The local interconnect 48 is electrically coupled to the polysilicon line 23 at the node 28. Local interconnects 44 and 48 can be any conductive material such as doped polysilicon, amorphous polysilicon, a single layer of metal (tungsten), or other substances. Additionally, local interconnects 44 and 48 can each be coupled to various other items associated with cell 10 or other integrated circuit elements. Preferably, local interconnects 44 and 48 are utilized to provide additional connections for cell 10.

U.S. Pat. No. 5,831,899 entitled Local Interconnect Structure And Process For Six-Transistor SRAM Cell discloses a method of fabricating local interconnects and a local interconnect that is comprised of a glue layer and a plug layer. An etch is performed to remove the plug layer from above the surface of the insulating layer. That leaves the glue layer for forming the local interconnects.

The particular geometry, and materials described with reference to FIG. 10 are shown only as exemplary embodiment. The particular geometry of cell 10 can be adjusted various ways to provide particular operating parameters for cell 10. For example, transistors 18, 20, 22 and 24 can be provided at various orientations to form cell 10. Changes in orientation will change the location of the local interconnects. Design rules are used to determine the size and position of structures within a given circuit design.

Figure 11:
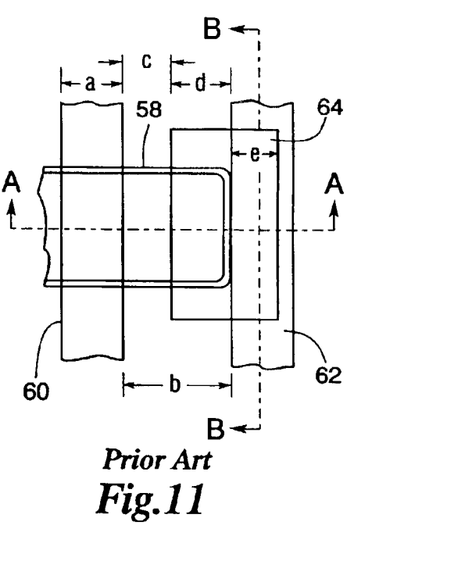
FIG. 11 illustrates various solid state structures which are laid out according to prior art design rules.

Some of the design rules which must be considered when designing a 6T SRAM cell utilizing local interconnects as well as other types of memory cells and other devices are explained with reference to FIG. 1. In FIG. 11, a moat 58 underlies a conducting line 60. These two elements are generally separated by a dielectric (not shown). A transistor may be formed from these elements. A conducting line 62 is located outside of moat 58. Local interconnect 64 overlies and connects moat region 58 and conducting line 62.

As is well known, design rules must be formulated and applied to any integrated circuit design configuration or process. These rules specify minimum (or maximum) distances for reliability and operation of the device. The rules are dependent upon many factors such as the variability in dimensions of the structures fabricated and the variability in alignment of one structural material to another. Both variabilities depend in turn on fabrication techniques applied and tolerances of the equipment used in fabrication. Illustrated in FIG. 11 are five minimum design rules which together dictate the minimum width to which the configuration shown may be fabricated. Distance "a" is the minimum line width for a polysilicon conducting line for a given device and fabrication process. A minimum distance "a" may be, for example, 0.8 $\mu$m. Note that the distances specified herein for design rules are exemplary only and would vary for different configurations and design processes. Distance "b" is the distance required between two conducting lines. A typical minimum distance "b" may be 1.0 μm. Distance "c" represents the minimum allowed distance between a local interconnect and an unrelated conducting line. This distance may be, for example, 0.7 μm. Distance "d" is the distance that the local interconnect 64 overlaps the moat region 58. A typical minimum design rule for distance "d" is 0.8 μm. Distance "e" is the distance that the local interconnect 64 overlaps the conducting line 62. A typical design rule minimum for distance "e" may be 0.6 μm. As can be seen then, the minimum width for this configuration from one conducting line to the other, including the width of both lines, must be at least a+c+d+e+(a−e). For the exemplary design rule distances given above, that would result in a minimum distance of 3.1 μm.

Additionally, it can be seen that the alignment of the local interconnect 64 over the conducting line is critical to achieve minimum distance "e" while not extending over the conducting line to thereby increase the width. Thus, production of local interconnects requires the careful alignment of a dedicated local interconnect mask.

The drive to make the fabrication process for circuits faster and easier depends, in part, on the ability to fabricate circuits in a manner that requires fewer masking steps. Thus, there is a need for a method of fabricating local interconnects without a separate step for aligning and using a local interconnect mask.

SUMMARY OF THE INVENTION

The invention is a method of fabricating a circuit in a manner to place certain structures within a predefined distance of one another. Electrical connections are formed between certain structures by a silicon out-diffusion which forms local interconnects. The silicon out-diffusion can be facilitated without a masking step thereby simplifying as well as speeding up the fabrication process.

According to another embodiment of the present invention, a method of fabricating local interconnects in a circuit without using a mask to define the local interconnects begins by fabricating the structures that are to be connected by a local interconnect within a bridging distance of one another. A metal layer is formed on top of at least the structures to be electrically connected together. The layer of metal is heated to cause an out-diffusion of a conductive element from material adjacent to the deposited metal so as to form electrical connections between the structures within the bridging distance. In a preferred embodiment of the present invention, the metal is formed on top of polysilicon such that the out-diffusion of the conductive element includes the out-diffusion of silicon. Residual metal/metal nitrides are removed from the oxide surface after local interconnect formation, i.e. post silicon out-diffusion and RTP anneal.

The present invention eliminates a masking step which is typically required to form the local interconnects. The present invention is particularly useful in the fabrication of a 6T SRAM cell and may be used on various types of integrated chips which carry more than one type of memory and logic on a chip. These advantages and benefits, and others, will be apparent from the Description of the Preferred Embodiment hereinbelow.

BRIEF DESCRIPTION OF THE DRAWINGS

For the present invention to be easily understood and readily practiced, the present invention will now be described, for purposes of illustration only and not limitation, in connection with the following figures wherein.

DESCRIPTION OF THE PREFERRED EMBODIMENT

A method of selectively forming local interconnects using design rules will now be described in conjunction with the FIGS. 1–7. The reader will understand that the process illustrated in FIGS. 1–7 is exemplary only; it is not intended to limit the present invention. The present invention of selectively forming interconnects using design rules may be applied using any process steps in which out-diffusion of a conductive element from surrounding material to form electrical connections can be relied upon. Thus, the present invention is limited by neither the selected process steps or the device being fabricated.

Recent trends of integrating more than one type of memory and logic on a chip has led to some interesting process integration challenges. For example, where SRAMs and DRAMs are fabricated on the same chip, careful consideration must be given to how the process steps will be integrated. Typically, SRAMs used for chips carrying both SRAM and DRAM cells use full CMOS 6T SRAM cells. 6T SRAM cells require local interconnects to strap the inverters. The present invention will be described in connection with the fabrication of interconnects for an embedded SRAM/DRAM process although, as previously mentioned, the concepts of the present invention are not limited to the described process steps or fabricated structure.

Figure 1:
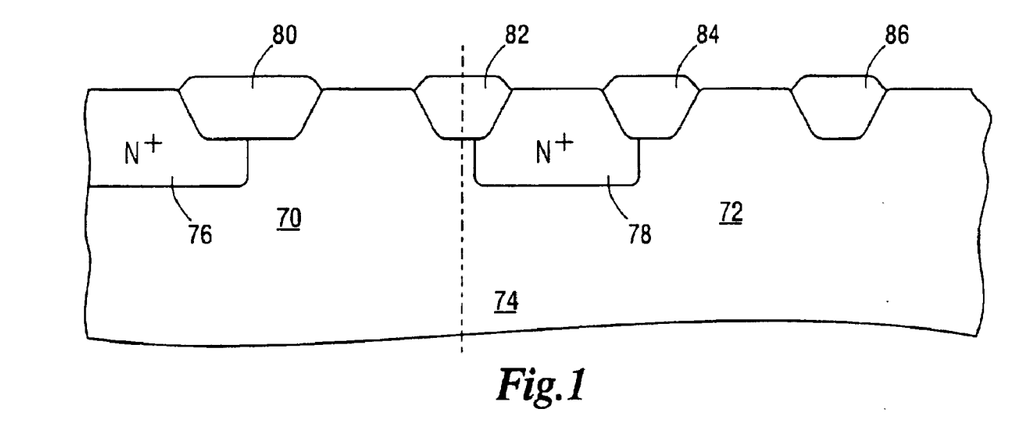
FIG. 1 illustrates portions of a substrate upon which transistors and other devices forming portions of an SRAM cell and a DRAM cell can be fabricated.

FIG. 1 illustrates a first portion 70 of a substrate 74 in which SRAM cells are to be fabricated and a second portion 72 of substrate 74 in which logic and DRAM cells are to be fabricated. A plurality of n wells, two of which 76, 78 are illustrated in FIG. 1, are fabricated upon substrate 74 using any known fabrication technique. Thereafter, isolation areas 80, 82, 84, and 86 may be fabricated using, for example, a shallow trench isolation technique. The substrate 74 illustrated in FIG. 1 is now ready for the formation of transistors.

Figure 2:
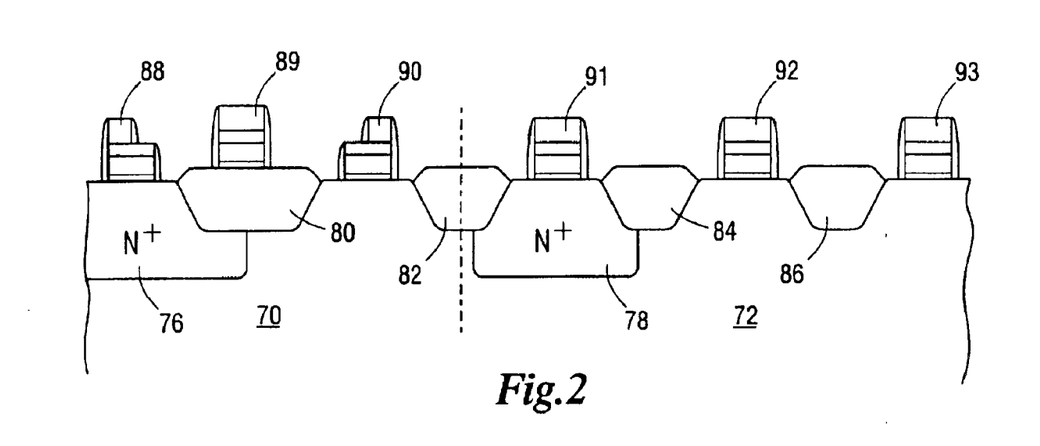
FIG. 2 illustrates the portion of the substrate shown if FIG. 1 after structures used for forming transistors have been fabricated.

Turning to FIG. 2, a plurality of structures 88, 89, 90, 91, 92 and 93 have been fabricated upon portions 70 and 72. Those of ordinary skill in the art will recognize that a substantial number of process steps have been performed to fabricate structures 88–93. Those steps may be performed in any manner consistent with the devices being fabricated, and typically rely upon the formation of alternating layers of insulating and conductive material such as nitride, polysilicon, oxides and the like. The structures 88–93 may have spacers fabricated on the sides thereof. The structures 88–93 function in conjunction with the substrate 74 in a known manner to form operative transistors. As the transistor formation step does not form a feature of the present invention, it is not further described herein.

Figure 3:
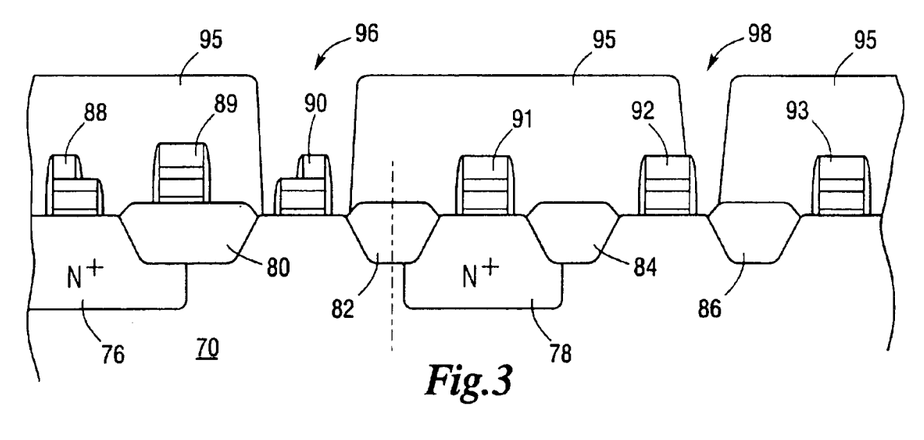
FIG. 3 illustrates the portion of the substrate shown if FIG. 2 after a layer of dielectric material has been formed and openings for n-polysilicon plugs have been fabricated.
Figure 4:
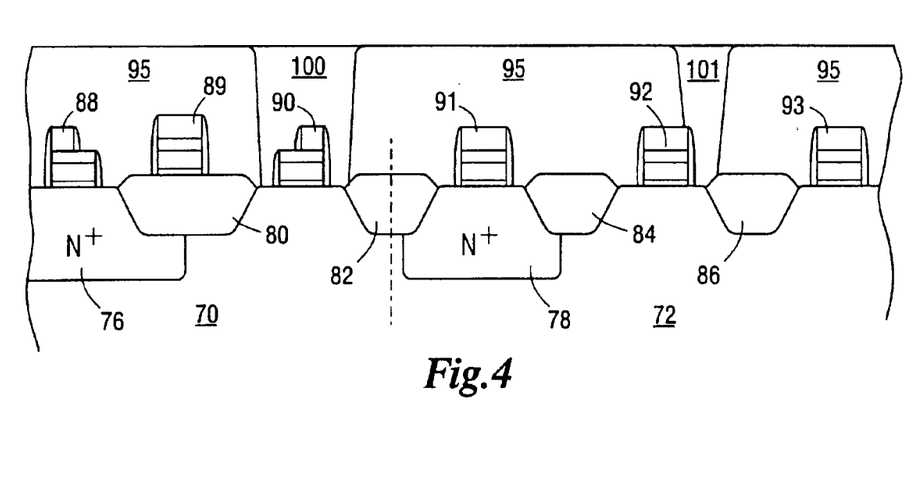
FIG. 4 illustrates the portion of the substrate shown in FIG. 3 after n-polysilicon plugs have been formed.

In FIG. 3, a layer of dielectric 95 has been formed on top of substrate 74. Thereafter, the process of n-polysilicon plug formation begins. A photoresist may be applied and etched selectively according to an n-polysilicon gate electrode and spacer mask to create openings 96 and 98. Thereafter, a layer of n-polysilicon is deposited and etched back to dielectric 95 such that openings 96 and 98 are filled with n-polysilicon 100 and 101, respectively, as shown in FIG. 4.

Figure 5:
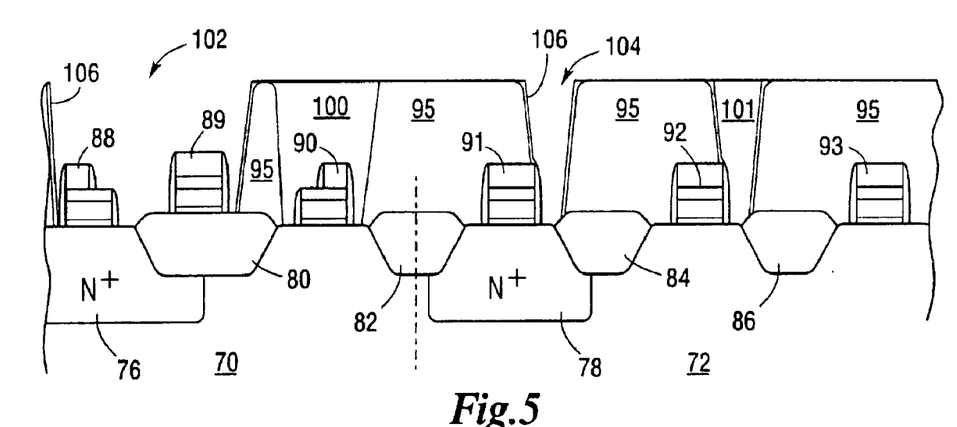
FIG. 5 illustrates that portion of the substrate illustrated in FIG. 4 after openings for p-polysilicon plugs have been fabricated.

Turning now to FIG. 5, additional openings 102 and 104 are created in layer 95 for the purpose of fabricating p-polysilicon plugs. The method steps for opening of layer 95 to create openings 102 and 104 may be similar to the steps used to create openings 96 and 98. More specifically, a layer of photoresist may be applied to the substrate followed by masking and selective removal of portions of layer 95 according to a gate electrode and spacer mask to create openings 102 and 104.

A diffusion barrier layer is formed and etched to leave a liner 106 within openings 102 and 104. Thereafter, a layer of p-polysilicon is deposited which, after being etched back, results in p-polysilicon plugs 108 and 109 in openings 102 and 104, respectively, as shown in FIG. 6.

Figure 6:
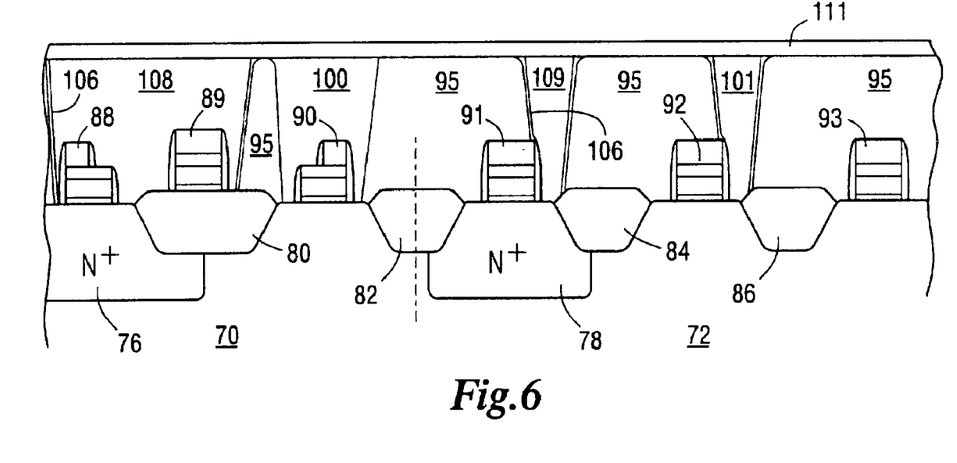
FIG. 6 illustrates the portion of the substrate shown in FIG. 5 after p-polysilicon plugs have been formed and after a layer of metal has been formed.

FIG. 6 also illustrates a metal layer 111 formed upon the substrate. The metal layer may be, for example, titanium (Ti) which is deposited or sputtered. The titanium may be pure, or it may be mixed with other metals such as cobalt or tungsten, or it may be sputtered with inert gas such as nitrogen. Nitrogen content in the titanium will change how much silicon out-diffusion takes place: The substrate is then subjected to an annealing step. The metal layer is chosen such that silicon out-diffuses, or out-migrates, from n-polysilicon plugs 100 and 101 and p-polysilicon plugs 108 and 109 into the adjacent metal layer. Where design rules have placed structures sufficiently close together, the out-diffusion of silicon will cause an electrical interconnection to form a bridge between the two adjacently located structures. For example, in FIG. 6, n-polysilicon plug 100 and p-polysilicon plug 108 are placed sufficiently close together such that out-diffusion from the silicon will form a bridge between the two structures. In that manner, design rules can be utilized to place structures which are to be electrically connected by local interconnects within a bridging distance of one another. While n-polysilicon plug 100 and p-polysilicon plug 108 have been placed close together, i.e., within the bridging distance, structures which are not to be electrically connected by a local interconnect such as n-polysilicon plug 101 and p-polysilicon plug 109 are placed outside of the bridging distance.

Figure 7:
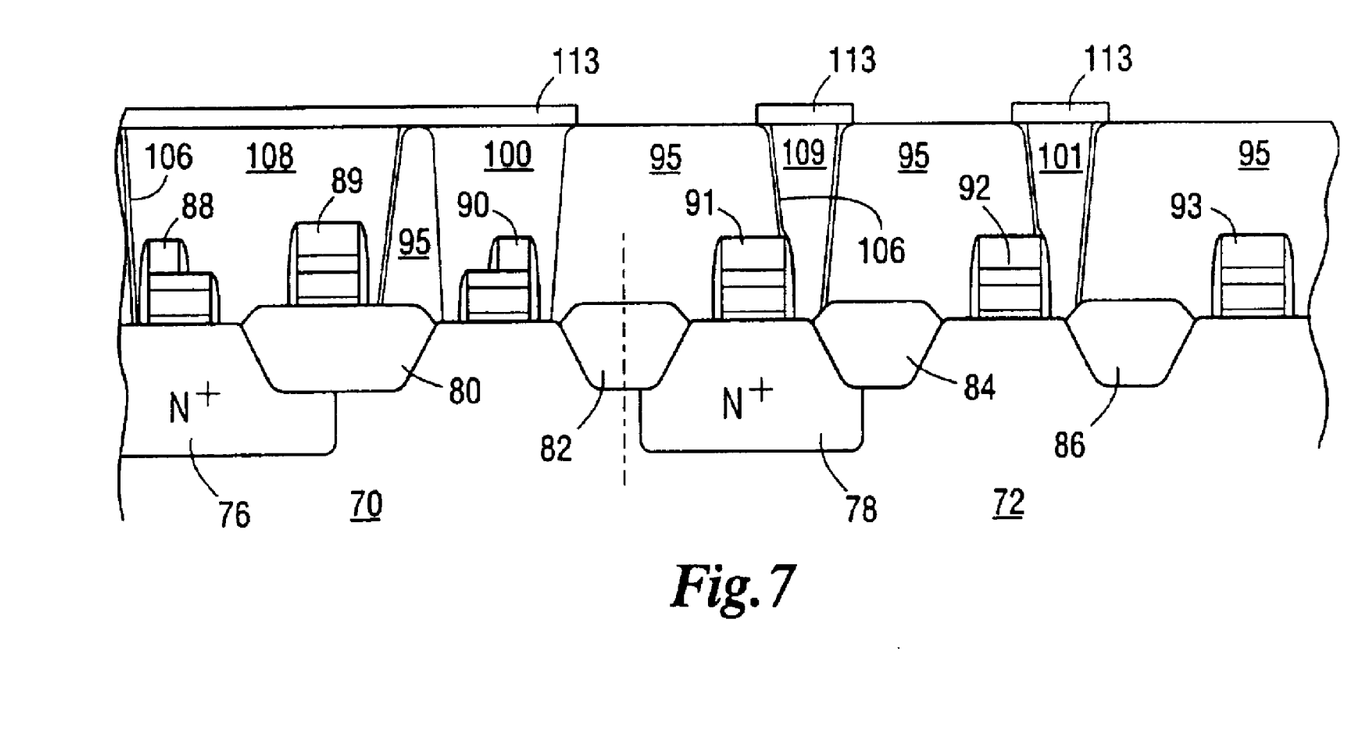
FIG. 7 illustrates the portion of the substrate shown if FIG. 6 after a heat-treated out-diffusion plus a selective wet clean step.

Turning now to FIG. 7, the layer 111 becomes a layer of titanium silicide (TiSix) 113 as a result of out-diffusion of silicon. A wet cleaning step is performed to selectively remove residual titanium, or titanium nitride (if annealed in nitrogen ambient) to leave only titanium silicide 113 in place. Thus, by separating the n-polysilicon and p-polysilicon plugs by a distance farther than the silicon out-diffusion distance, the distance the silicon will out-migrate becomes the bridging distance.

As an option to the formation of a layer of titanium, a selective tungsten/titanium/titanium silicide deposition can be performed which nucleates substantially more on polysilicon than on oxide or BPSG. The residual titanium is again wet-etched from the areas of the chip that do not have silicided plugs.

There are several advantages to the present invention. First, by causing the silicon out-diffusion by the deposition of a uniform layer of metal, or the use of a process which nucleates only on polysilicon, a masking step is saved. There are numerous ways of controlling the amount of silicon out-diffusion such as the thickness of the titanium or metal layer and the temperature of the anneal. Also, design rules can be relied upon to allow local interconnects to form where desired, but prevent local interconnects from forming where they are not desired. That creates great flexibility allowing the process of the present invention to be integrated into many types of fabrication processes used with DRAMs.

The process is compatible with silicidation as well as various selective deposition processes that selectively nucleate on polysilicon, as previously mentioned. That provides additional flexibility in integrating various process steps. If silicide is not desired on certain portions of the substrate, it can be easily wet-etched in HF using a wet clean and a mask already in use, e.g. DRAM plug/contact mask.

While the present invention has been described in connection with titanium and polysilicon, other combinations of materials can be used once the degree of out-diffusion for various process parameters has been measured. For example, in the present invention, the table hereinbelow sets forth exemplary process parameters and how those process parameters affect the bridging distance.

| Ti Thickness | RTP temp N2 | Approx. Bridging distance |
| --- | --- | --- |
| 50–150 A | 650 C.–700 C. | upto 0.2 um +/− 0.05 um |
| 150–300 A | 650 C.–700 C. | upto 0.3 um +/− 0.05 um |
| 150–300 A | 700 C.–750 C. | upto 0.4 um +/− 0.05 um |
| >300 A | >750 C. | > = 0.4 um |

Figure 8:
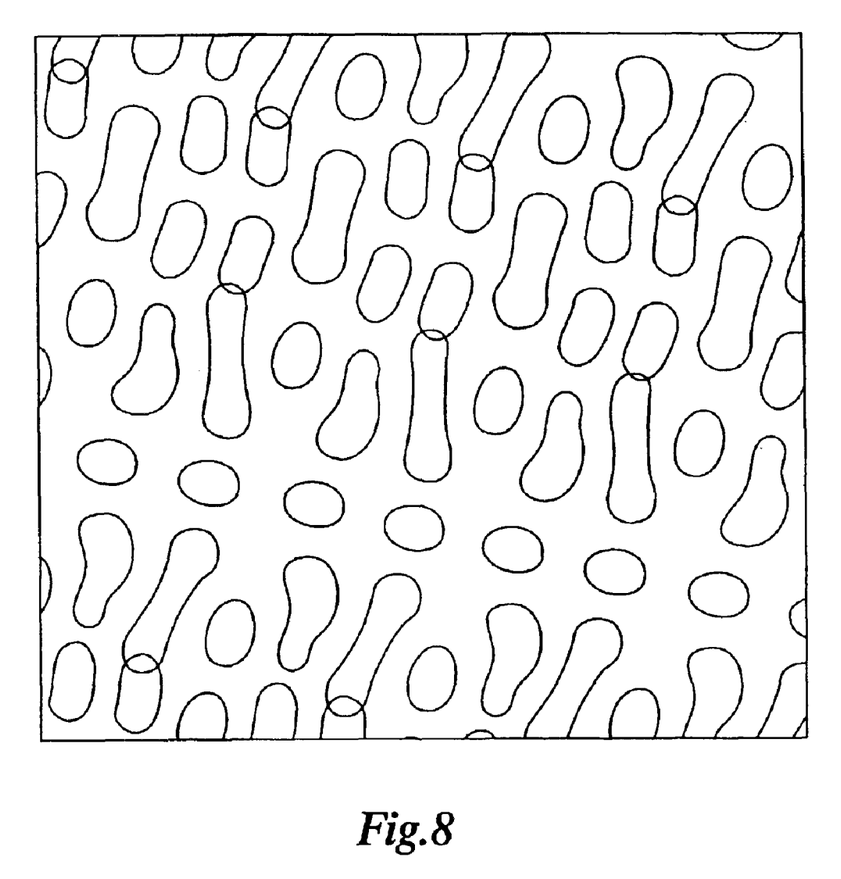
FIG. 8 is a top view looking down on local interconnects formed according to the teachings of the present invention.

Finally, FIG. 8 is a top view looking down on local interconnects formed according to the teachings of the present invention. The parameters used to obtain the results illustrated in FIG. 8 are illustrated in the second row of the table.

Figure 12:
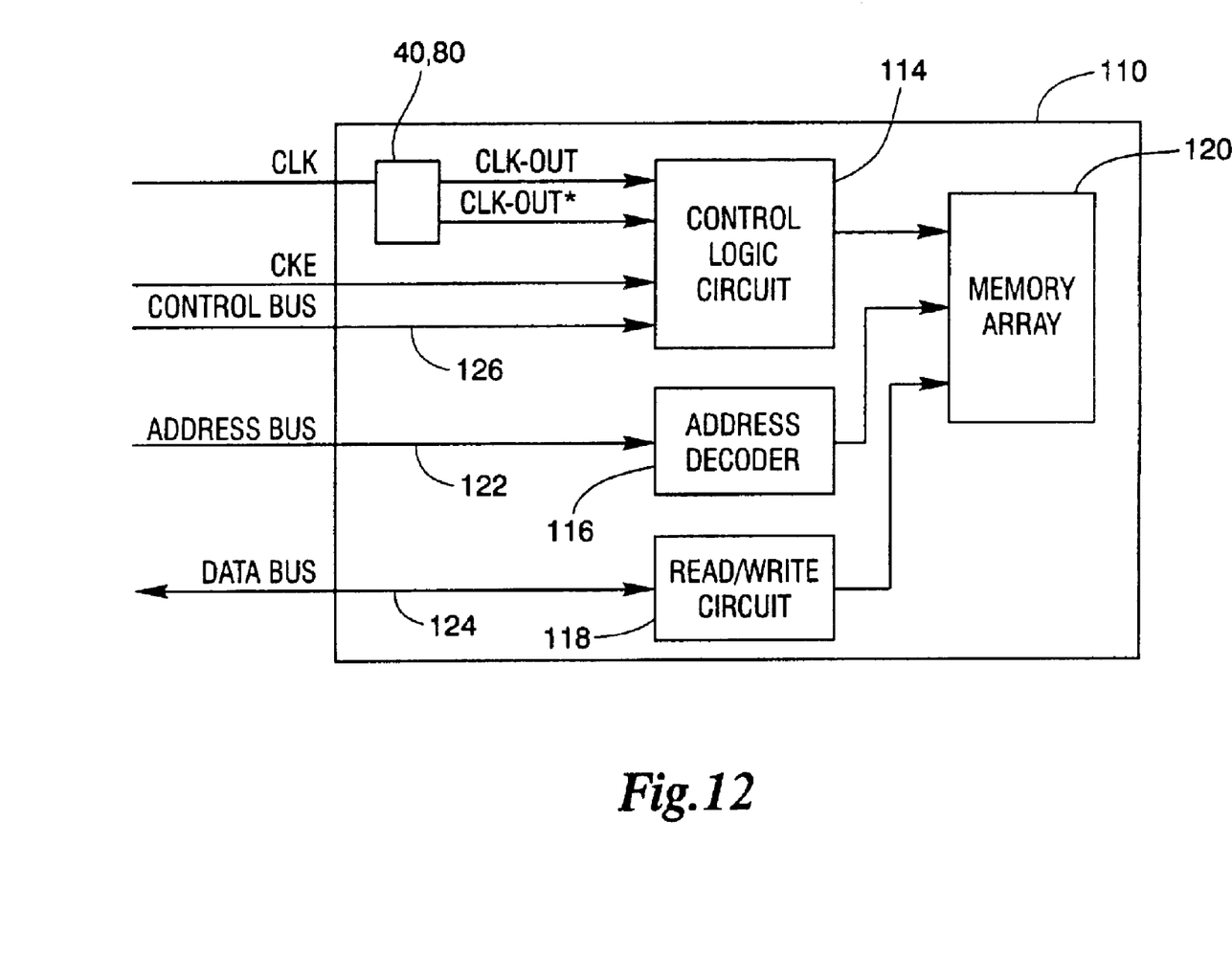
FIG. 12 illustrates a memory device incorporating the interconnect of the present invention.

The local interconnects of the present invention may be used in a variety of devices, including, as shown in FIG. 12, a synchronous dynamic random access memory 110 ("SDRAM"). The SDRAM 110 includes a control logic circuit 114, an address decoder 116, and a read/write circuit 118, all of which are coupled to a memory array 120. As is well known in the art, the address decoder 116 receives an address over an address bus 122 and provides a decoded address to the memory array 120 to select an individual memory cell in the memory array. The read/write circuit 118 operates to received data over a data bus 124 and provide that data to the memory array 120 during a write operation, and to provide data from the memory array to the data bus during a read operation.

The SDRAM 110 performs data transfer operations under control of the control logic circuit 114 which receives data transfer commands, including read or write commands, over a control bus 126. In response to these data transfer commands, the control logic circuit 114 executes each of the steps required to perform a read or write data transfer operation. The SDRAM 110 also receives a clock signal CLK to control the timing of various operations. The clock signal CLK is converted to complementary clock signals CLK-OUT and CLK-OUT*. The CLK-OUT and CLK-OUT* signals are applied to the control logic circuit 114 to cause the control logic circuit 114 to synchronously execute one or more memory operations twice for each cycle of the CLK signal. These operations are performed at intervals that are spaced substantially equally from each other because of the symmetry of the CLK-OUT and CLK-OUT* signals. A clock enable signal CKE enables the clocking of the control logic circuit 114 by the CLK-OUT and CLK-OUT* signals.

Figure 13:
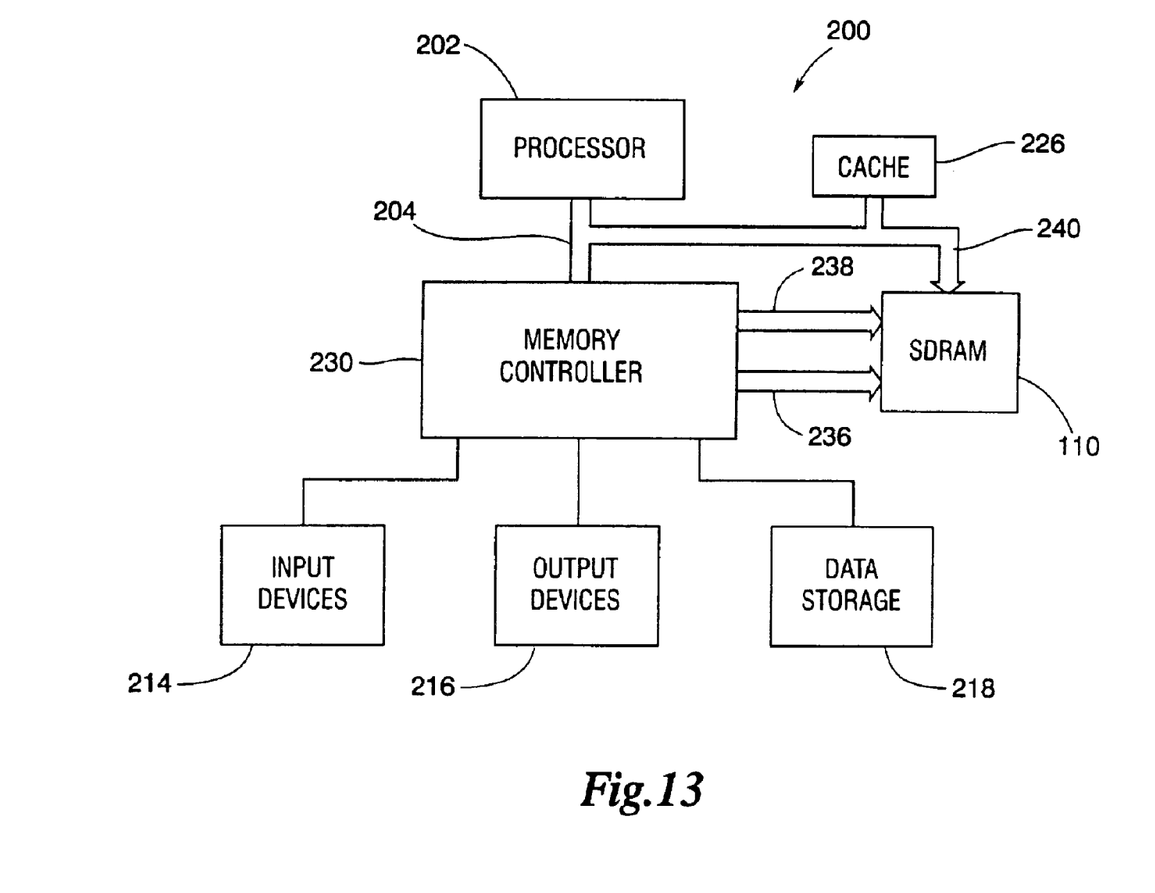
FIG. 13 illustrates a system in which the memory device of FIG. 12 may be used.

FIG. 13 illustrates a computer system 200 containing the SDRAM 110 of FIG. 12. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 110 through a memory controller 230. The memory controller 230 normally includes a control bus 236 and an address bus 238 that are coupled to the SDRAM 110. A data bus 240 may be coupled to the processor bus 204 either directly (as shown), through the memory controller 230, or by some other means.

While the present invention has been described in combination with an exemplary embodiment thereof, those of ordinary skill in the art will recognize that many modifications and variations are possible. As previously mentioned, the present invention may be used in combination with other processes in the fabrication of other types of devices or structures. Other types of materials may be used to cause out-diffusion provided that the out-diffusion process is quantified such that design rules can be established. Such modifications and variations are intended to fall within the scope of the following claims.

What is claimed is:

1. A method of laying out a circuit using design rules, the improvement comprising:

locating structures that are to be connected by local interconnects within a bridging distance defined by a silicon out-diffusion distance.

2. The method of claim 1 further comprising:

defining said bridging distance as a distance within a minimum distance and a maximum distance between said structures necessary for operating said circuit.

3. The method of claim 2 further comprising:

determining variations between at least one of dimensions of one structure to another structure and alignment of one structural material to another structural material, said variations being used to define said minimum distance and said maximum distance.

4. The method of claim 3 wherein said determining variations comprises:

incorporating information related to a fabrication technique used for said circuit; and incorporating tolerances of a fabrication machine used for said circuit.

5. The method of claim 1 for a circuit having at least one of a conducting line and a moat, said method further comprising incorporating at least one of:

a minimum width for said conducting line;

a minimum distance between two conducting lines;

a minimum distance between said local interconnects and an unrelated conducting line;

a distance that one of said local interconnects overlaps said moat region; and a distance that one of said local interconnects overlaps said conducting line.

\* \* \* \* \*

UNITED STATES PATENT AND TRADEMARK OFFICE
CERTIFICATE OF CORRECTION

PATENT NO.        : 6,930,901 B2                                     Page 1 of 1
APPLICATION NO.   : 10/245679
DATED             : August 16, 2005
INVENTOR(S)       : Todd Abbott et al.

It is certified that error appears in the above-identified patent and that said Letters Patent is hereby corrected as shown below:

On the title page item (75), line 2, replace "Tiryedi" with --Trivedi--.

Column 2, Line 43, replace "FIG. 1" with --FIG. 11--.

Signed and Sealed this

Seventeenth Day of April, 2007

JON W. DUDAS
*Director of the United States Patent and Trademark Office*